(12) United States Patent
Wu

(10) Patent No.: US 6,731,427 B1
(45) Date of Patent: May 4, 2004

(54) SEMICONDUCTOR OPTICAL AMPLIFIER SYSTEMS

(75) Inventor: Yongan Wu, San Jose, CA (US)

(73) Assignee: Onetta, Inc., Sunnyvale, CA (US)

( * ) Notice: Subject to any disclaimer, the term of this patent is extended or adjusted under 35 U.S.C. 154(b) by 83 days.

(21) Appl. No.: 10/046,236

(22) Filed: Jan. 16, 2002

Related U.S. Application Data

(60) Provisional application No. 60/317,193, filed on Sep. 6, 2001.

(51) Int. Cl.[7] ............................................. H01S 3/00
(52) U.S. Cl. ....................................................... 359/344
(58) Field of Search ............................. 359/344; 372/6

(56) References Cited

U.S. PATENT DOCUMENTS

| | | | |
|---|---|---|---|
| 4,745,612 A | 5/1988 | Hayakawa et al. | 372/45 |
| 5,189,679 A | 2/1993 | Derry et al. | 372/45 |
| 5,208,183 A | 5/1993 | Chen et al. | 437/129 |
| 5,218,613 A | 6/1993 | Serreze | 372/45 |
| 5,287,377 A | 2/1994 | Fukuzawa et al. | 372/45 |
| 5,345,456 A | 9/1994 | Dai et al. | 372/22 |
| 5,430,759 A | 7/1995 | Yokev et al. | 375/202 |
| 5,946,129 A | 8/1999 | Xu et al. | 359/332 |
| 6,014,235 A | 1/2000 | Norte | 359/109 |
| 6,028,875 A | 2/2000 | Knight et al. | 372/46 |
| 6,052,222 A | 4/2000 | Kitamaura | 359/344 |
| 6,122,306 A | 9/2000 | Sartoriuos et al. | 372/96 |
| 6,141,477 A | 10/2000 | Kitamura | 385/313 |
| 6,186,631 B1 * | 2/2001 | Behringer et al. | 359/344 |
| 6,192,058 B1 | 2/2001 | Abeles | 372/6 |
| 6,215,805 B1 | 4/2001 | Sartorious et al. | 372/50 |

OTHER PUBLICATIONS

Silver et al. "Design and ASE Characteristics of 1550–nm Polarization Insensitive Semiconductor Optical Amplifiers Containing Tensile and Compressive Wells" IEEE Journal of Quantum Electronics, vol. 36, No. 1, p. 118–122, Jan., 2000.

Ryu et al. "Fabrication and Analysis of Polarization Insensitive 1.55µm InGaAsP/InP Quantum Well Semiconductor Optical Amplifiers" p. 642.

Liu et al. "A Study on the Polarization Sensitive Performance of the Strained Quantum Well Semiconductor Optical Amplifiers." SPIE vol. 3896, p. 494–498 Nov., Dec., 1999.

Schimpe et al. "Compact 2x2 Switch with Optical Amplifier Gates" CLEO, 1994, p. 77.

Kitamura et al. "Angled Facet S–Bend Semiconductor Optical Amplifiers for High–Gain and Large–Extinction Ratio" IEEE Photonics Technology Letters, vol. 11, No. 7 (Jul., 1999).

Saini et al. "Lossless 1x2 Optical Switch Monolithically Integrated on a Passive Active Resonant Coupler (PARC) Platform" IEEE Photonics Technology Letters, vol. 12, No. 7, Jul. 2000.

\* cited by examiner

Primary Examiner—Mark Hellner
(74) Attorney, Agent, or Firm—G. Victor Treyz

(57) ABSTRACT

Semiconductor optical amplifier devices and optical amplifiers are provided for handling optical data signals carried on wavelength-division-multiplexing channels in fiber-optic links. The optical amplifiers may have multiple semiconductor optical amplifier devices separated by isolators to reduce backwards scattered light and thereby improve their output power handing capabilities. Waveguide structures on the semiconductor optical amplifier devices may be used to provide lateral light confinement during optical amplification. Nonuniform drive current densities may be used along the lengths of the semiconductor waveguide structures to support increased output powers.

10 Claims, 10 Drawing Sheets

SEMICONDUCTOR OPTICAL AMPLIFIER SYSTEMS

This application claims the benefit of provisional patent application No. 60/317,193, filed Sep. 6, 2001.

BACKGROUND OF THE INVENTION

The present invention relates to fiber-optic communications networks, and more particularly, to semiconductor optical amplifiers used in such networks.

Fiber-optic networks are used to support voice and data communications. In optical networks that use wavelength division multiplexing, multiple wavelengths of light are used to support multiple communications channels on a single fiber.

Optical amplifiers are used in fiber-optic networks to amplify optical signals. For example, optical amplifiers may be used to amplify optical data signals that have been subject to attenuation over fiber-optic paths. A typical amplifier may include erbium-doped fiber coils that are pumped with diode lasers. Raman amplifiers and semiconductor optical amplifiers are also being investigated for use in fiber-optic links.

One problem with existing semiconductor optical amplifiers is that their maximum output powers tend to be lower than the maximum output powers available from other types of amplifiers.

It is an object of the present invention to provide semiconductor optical amplifiers for use in fiber-optic communications systems.

It is also an object of the present invention to provide semiconductor optical amplifiers that are capable of handling relatively high maximum output powers.

SUMMARY OF THE INVENTION

These and other objects of the invention are accomplished in accordance with the present invention by providing semiconductor optical amplifiers for use in optical amplifiers and other optical network equipment in fiber-optic communications networks. The fiber-optic networks may include communications links that are used to carry optical data signals associated with wavelength-division-multiplexing channels.

Semiconductor optical amplifiers may be provided that use multiple semiconductor optical amplifier devices. Isolators may be used between semiconductor devices to increase the overall power handling capacity of the semiconductor amplifiers.

Semiconductor optical amplifier devices may be provided that have increased power handling capabilities. These devices may use nonuniform drive current densities to enhance the output power capabilities of the devices without inducing lasing.

Further features of the invention and its nature and various advantages will be more apparent from the accompanying drawings and the following detailed description of the preferred embodiments.

DETAILED DESCRIPTION OF THE PREFERRED EMBODIMENTS

Figure 1:
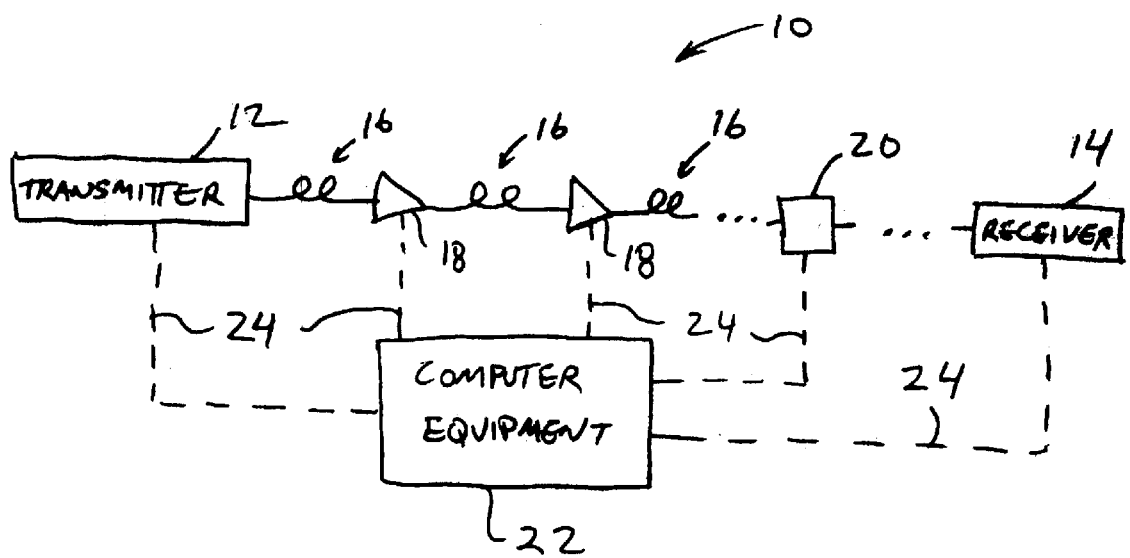
FIG. 1 is a schematic diagram of an illustrative fiber-optic communications link in accordance with the present invention.

An illustrative fiber-optic communications link 10 in an optical communications network in accordance with the present invention is shown in FIG. 1. A transmitter 12 may transmit information to a receiver 14 over a series of fiber links. Each fiber link may include a span 16 of optical transmission fiber. Fiber spans 16 may be on the order of 40–160 km in length for long-haul networks or may be any other suitable length for use in signal transmission in an optical communications network. Link 10 may be a point-to-point link, part of a fiber ring network, or part of any other suitable network or system.

The communications link of FIG. 1 may be used to support wavelength division multiplexing arrangements in which multiple communications channels are provided using multiple wavelengths of light. For example, the link of FIG. 1 may support a system with 40 channels, each using a different optical carrier wavelength. Optical channels may be modulated at, for example, approximately 10 Gbps (OC-192). The carrier wavelengths that are used may be in the vicinity of 1527–1605 nm. These are merely illustrative system characteristics. If desired, fewer channels may be provided (e.g., one channel), more channels may be provided (e.g., hundreds of channels), signals may be carried on multiple wavelengths, signals may be modulated at slower or faster data rates (e.g., at approximately 2.5 Gbps for OC-48 or at approximately 40 Gbps for OC-768), and different carrier wavelengths may be supported (e.g., individual wavelengths or sets of wavelengths in the range of 1240–1670 nm).

Optical amplifiers 18 may be used to amplify optical signals on link 10. Optical amplifiers 18 may include booster amplifiers, in-line amplifiers, and preamplifiers. Optical amplifiers 18 may be based on semiconductor optical amplifier devices. If desired, some optical amplifiers 18 may be based on rare-earth-doped fiber amplifiers such as erbium-doped fiber amplifiers, amplifiers that include discrete Raman-pumped coils, amplifiers that include pumps for optically pumping spans of transmission fiber 16 to create optical gain through stimulated Raman scattering, or other suitable optical amplifiers.

Link 10 may include optical network equipment such as transmitter 12, receiver 14, and amplifiers 18 and other optical network equipment 20 such as dispersion compensation modules, dynamic filter modules, add/drop multiplexers, optical channel monitor modules, Raman pump modules, optical switches, etc. For clarity, aspects of the present invention will be described primarily in the context of optical network equipment 20 having gain stages such as optical amplifiers 18. This is, however, merely illustrative. The features of the present invention may be used for any suitable optical network equipment if desired.

Computer equipment 22 may be used to implement a network management system. Computer equipment such as computer equipment 22 may include one or more computers or controllers and may be located at network nodes and one or more network management facilities. As indicated by lines 24, the network management system may communicate with optical amplifiers 18, transmitter 12, receiver 14 and other optical network equipment 20 using suitable communications paths. The communications paths may be based on any suitable optical or electrical paths. For example, communications paths 24 may include service or telemetry channel paths implemented using spans 16, may include wired or wireless communications paths, may involve communications paths formed by slowly modulating the normal data channels on link 10 at small modulation depths, etc. Paths 24 may also be used for direct communications between amplifiers 18 and other optical network equipment.

Computer equipment 22 may be used to gather spectral information from transmitter 12 (e.g., an output power spectrum), receiver 14 (e.g., a received power spectrum), and amplifiers 18 and other equipment 20 (e.g., input and output power spectra and gain spectra). If amplifiers 18 and the other equipment on the link have spectral adjustment capabilities, the spectral information may be used in adjusting the spectral properties of this equipment. Computer equipment 22 may issue commands such as spectral adjustment commands, gain adjustment commands, and other commands to amplifiers 18, transmitters 12, receivers 14, and other equipment 20 that direct this equipment to take appropriate actions.

Spectral adjustments may be made in the output power of transmitter 12 by adjusting a dynamic filter or variable optical attenuators in transmitter 12 to control the output powers of the channels in transmitter 12. Transmitter spectral adjustments may also be made by adjusting the strengths of the drive currents used to drive transmitter laser sources in transmitter 12. Spectral adjustments may be made in the input power for receiver 14 by adjusting a dynamic filter or variable optical attenuators before the received signals are processed by the detectors in receiver 14.

Spectral adjustments in equipment 20 and amplifiers 18 may be made using dynamic filter arrangements, individual variable optical attenuators, variable optical attenuator arrays, gain stage adjustments, or any other suitable spectral adjustment arrangements.

Figure 2:
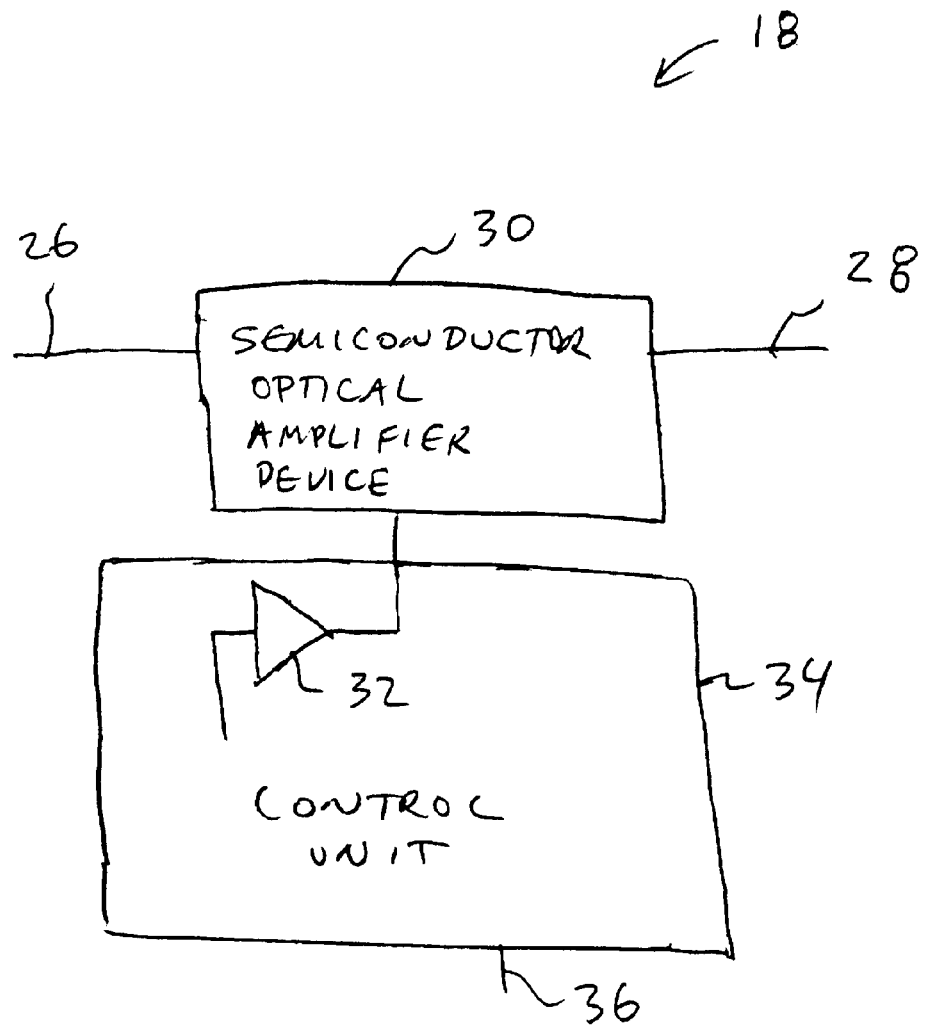
FIG. 2 is a schematic diagram of an illustrative optical amplifier based on a semiconductor optical amplifier device in accordance with the present invention.

An illustrative optical amplifier 18 is shown in FIG. 2. Optical input signals may be provided to input fiber 26. Corresponding amplified output signals may be provided at output fiber 28. The optical input signals may be, for example, data traffic being carried on the wavelength-division-multiplexing channels in the signal band of link 10 that is provided to input fiber 26 over a span of fiber 16. One or more gain stages based on semiconductor optical amplifier devices such as semiconductor optical amplifier device 30 may be used to provide optical gain for the optical signals. Semiconductor optical amplifier devices such as semiconductor optical amplifier device 30 may be based on any suitable semiconductor structure. Such devices may, for example, be based on structures resembling semiconductor diode lasers with antireflection (AR) coated front and rear facets to prevent lasing. The semiconductor optical amplifier devices may have active regions that are based on bulk semiconductor material, quantum well structures, compressive and/or extensile strained quantum well structures, quantum wire structures, quantum dot structures, or other suitable semiconductor structures.

Drive current for operating device 30 may be provided by one or more current drivers such as current driver 32 in control unit 34. Control unit 34 may be based on any suitable control circuitry and may include one or more microprocessors, microcontrollers, digital signal processors, field-programmable gate arrays or other programmable logic devices, application-specific integrated circuits, digital-to-analog converters, analog-to-digital converters, analog control circuits, memory devices, etc. Control unit 34 may include communications circuitry that supports the communications between control unit 34 and computer equipment such as computer equipment 22 of FIG. 1 or other equipment in the network. Control unit 34 may use a communications path such as path 36 to communicate with computer equipment 22.

The drive current for device 30 creates optical gain in the active region of device 30 that amplifies the optical signals from fiber 26 before they are provided to fiber 28. To ensure proper operation of device 30 as a semiconductor optical amplifier, device 30 should be driven with a drive current that creates an overall optical gain that is sufficiently low to avoid creating lasing action in device 30. The front and rear facets of device 30 may also be provided with AR coatings to help prevent lasing. The light and gain path may be formed at an angled with respect to the facets or may include an unguided region to reduce facet feedback.

Figure 3:
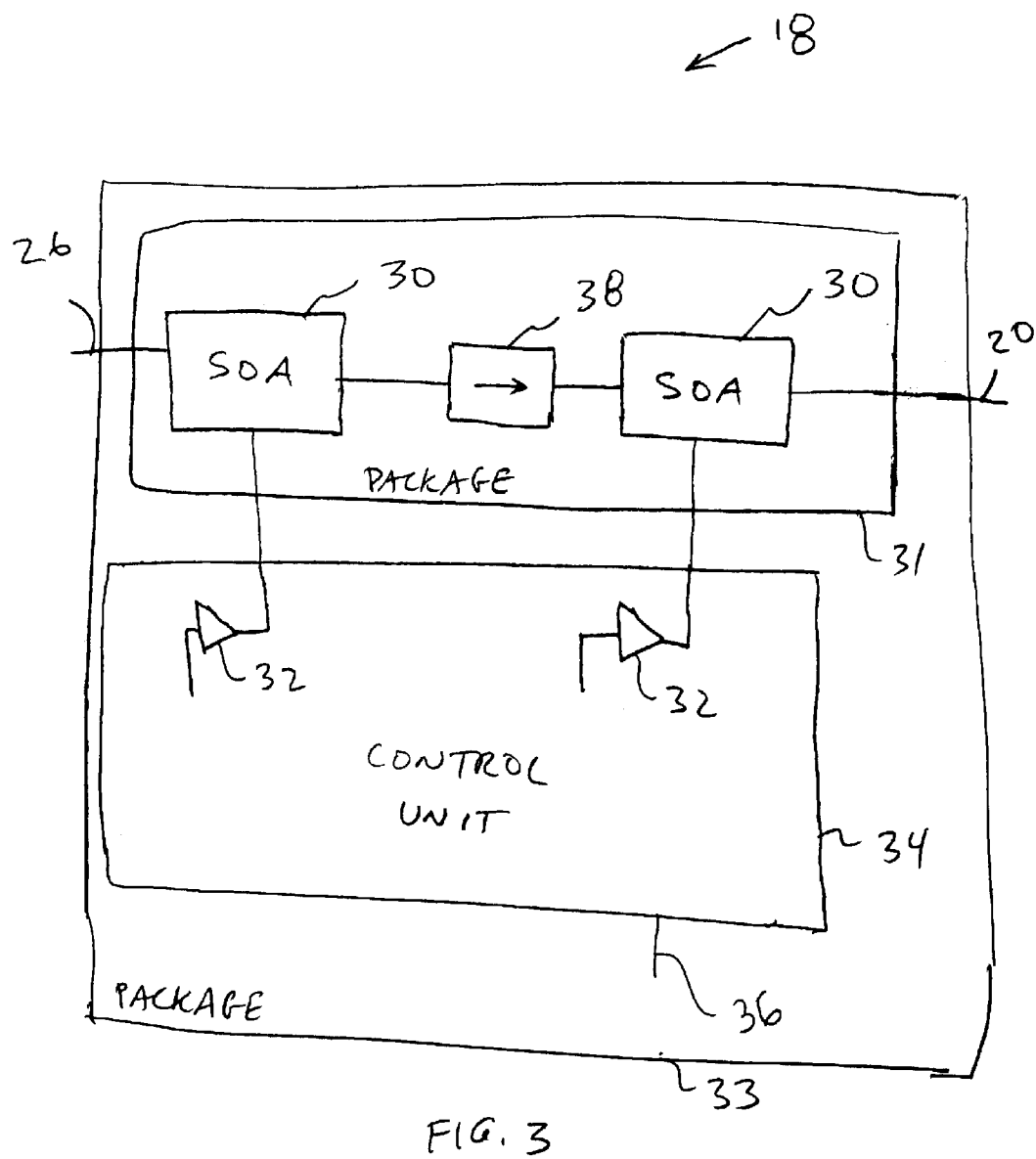
FIG. 3 is a schematic diagram of an illustrative optical amplifier based on two semiconductor optical amplifier devices separated by an isolator in accordance with the present invention.

As shown in FIG. 3, a semiconductor optical amplifier 18 may be provided that uses two separate semiconductor optical amplifier devices 30. Each device 30 may be formed using a separate piece or portion of semiconductor material.

Devices 30 may or may not be housed in a common package or structure such as package 31 or 33.

Isolator 38 may be used to prevent light in amplifier 18 from traveling in the backwards direction between the second device 30 and the first device 30. As a result, isolator 38 helps ensure that devices 30 will not lase, even under relatively high drive currents. In order to enhance the efficiency and power handling capabilities of amplifiers 18 of the type shown in FIG. 18, devices 30 may be driven with different strengths. For example, if identically-sized devices 30 are used, the driver 32 for the first or upstream device 30 may be driven with a smaller current than is produced by the driver 32 for the second or downstream device 32. This arrangement improves efficiency, because the first device 30 is not driven with more current than necessary and improves performance because the second device 30 is driven hard enough to ensure that an adequate maximum output power is reached.

In the example of FIG. 3, two devices 30 are shown as being separated by a single isolator 38. If desired, more devices 30 may be used in an amplifier 18. Isolators may be placed between two or three or more pairs of such devices 30 to help increase the maximum power handling capability of amplifier 18 without inducing lasing.

The isolator may be a free space isolator. Coupling lenses may be used before and after the isolator to enhance the light coupling between devices 30 and the isolator.

Using isolators between devices 30 in amplifiers 18 also helps to reduce noise that might otherwise arise from backscattered light.

Another way to enhance the output power capacity of amplifiers 18 involves providing semiconductor optical devices 30 with drive currents that are not uniform along their lengths. With this type of arrangement, drive current is conserved near the input of the device 30, where the gain of the device is typically (at least initially) far from saturation. Near the output of the device 30, the drive current may be increased to support the need for a higher output power. Using a higher drive current supports higher output powers because the higher current tends to increase the saturation power of the device. Because the drive current near the input is lower than would be the case in a uniformly driven device, the overall (round-trip) gain of the device may be maintained low enough to avoid lasing and gain spectral ripple and ASE noise from the input region may be reduced.

Figure 4:
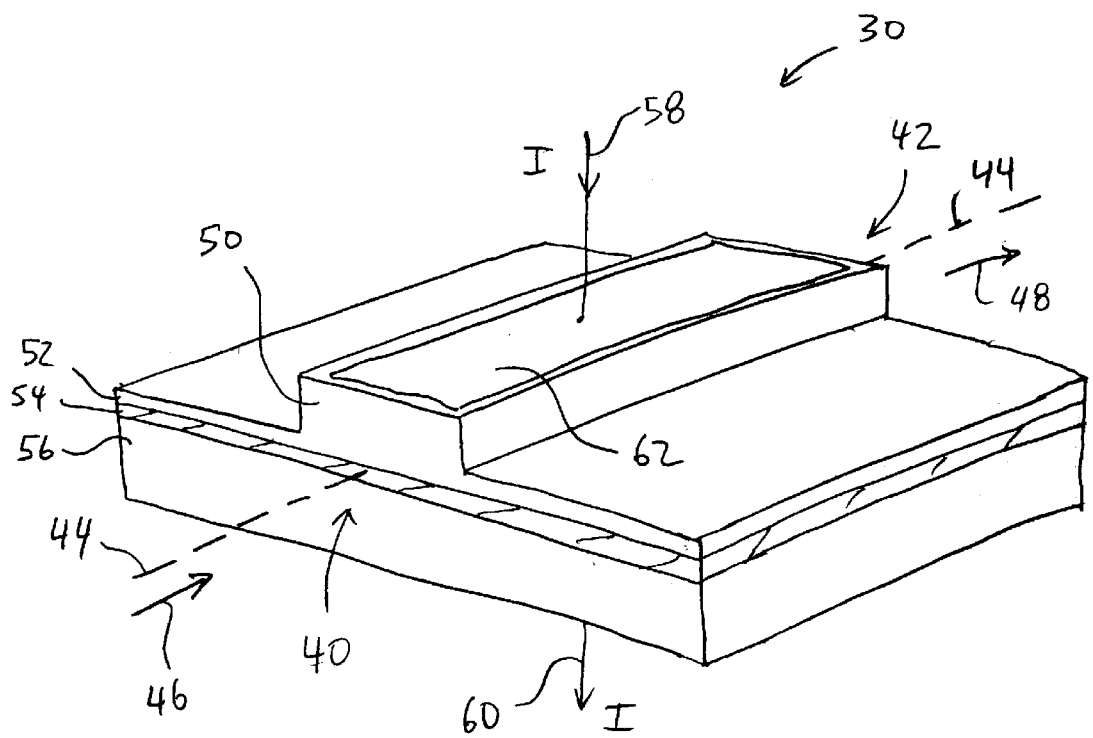
FIG. 4 is a perspective view of an illustrative semiconductor optical device having a uniform drive current density along the length of the waveguide region in accordance with the present invention.

A semiconductor device 30 suitable for operation with a uniform drive current density distribution is shown in FIG. 4. The device 30 of FIG. 4 may be used in some of amplifiers 18 while nonuniform drive current devices are used for other amplifiers 18. If desired, devices 30 with uniform drive current arrangements of the type shown in FIG. 4 may be used in amplifiers 18 of the multiple-device type described in connection with FIG. 3.

As shown in FIG. 4, optical data signals from a fiber 16 may be launched into device 30 at input 40. Corresponding amplified optical data signals exit device 30 at output 42. Input 40 and output 42 may have AR coatings to reduce the tendency of device 30 to lase. Device 30 may also use optical coupling arrangements such as lenses for coupling light into and out of fibers such as fibers 26 and 28, may have an associated mounting structure, etc. These details are not shown in FIG. 4 to avoid over-complicating the drawing.

The light that is provided to device 30 travels along longitudinal axis 44 in direction 46 (at input 40) and direction 48 (at output 42). Lateral confinement may be provided using any suitable waveguide structure. In the example of FIG. 4, device 30 has a ridge waveguide structure 50 that is used to provided lateral confinement. Vertical confinement is provided by an index of refraction difference between a region surrounding active layer 54 (or active layer 54) and cladding layers such as layers 52 and 56. Cladding layer 56 may be a semiconductor substrate or may be a layer formed on top of a semiconductor substrate. The active layer may be formed using bulk material, quantum well structures, or any other suitable structures. To provide optical amplification in the wavelength regions of interest for fiber-optic communications, a semiconductor material system such as the InGaAlAsP material system or any other suitable material system may be used to form the various layers of device 30. The semiconductor device 30 may be formed from a wafer of semiconductor material. After processing, individual devices 30 may be formed by cleaving or otherwise dividing the wafer into individual die.

Drive current for device 30 may be provided through metallization layers or other suitable conductive layers or paths that are shown schematically by lines 58 and 60. With the uniform drive current arrangement of FIG. 4, a contact pad such as pad 62 may be used to distribute current I along the length and width of the waveguide formed by ridge 50. The length of the waveguide is the length of the structure along longitudinal axis 44. The width of the waveguide is the distance across ridge 50 perpendicular to axis 44 and in the plane of the surface of device 30.

Figure 5:
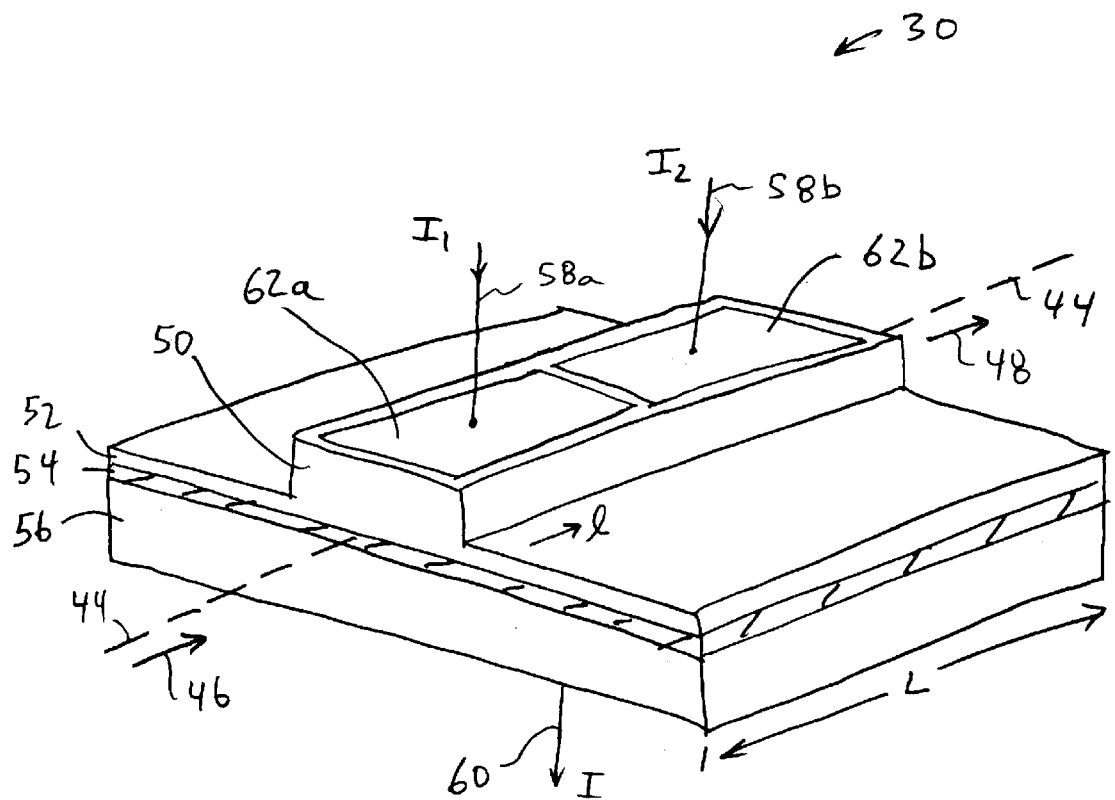
FIG. 5 is a perspective view of an illustrative semiconductor optical device having an nonuniform drive current density along the length of the waveguide region in accordance with the present invention.

As shown in FIG. 5, device 30 may be driven with current using a nonuniform current density drive scheme. With this type of arrangement, the active regions underlying different portions along the length of the device receive different effective drive current densities.

In the example of FIG. 5, a nonuniform current distribution is provided by using a contact pad 62 with two portions—contact pad 62a and contact pad 62b. Contact pad 62a may be supplied with a current $I_1$ through path 58a that is smaller than the current $I_2$ that is supplied to contact pad 62b through path 58b. If contact pads 62a and 62b have the same area, the current density (i.e., the current per unit area) that is flowing through the first portion of the waveguide on device 30 (i.e., the portion including the active region below pad 62a) will be smaller than the current density that is flowing through the second portion of the waveguide on device 30 (i.e., the portion including the active region below pad 62b).

Figure 6:
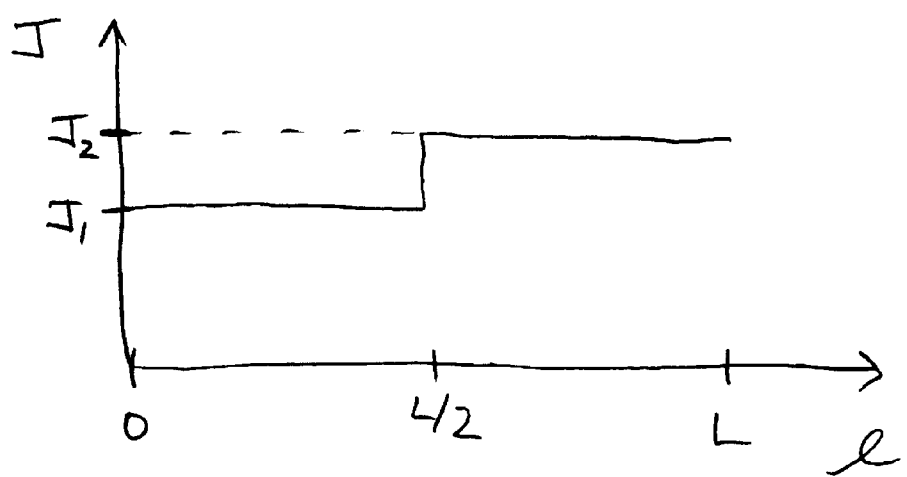
FIG. 6 is a graph of an illustrative nonuniform drive current density profile that may be used in operating a semiconductor optical device in accordance with the present invention.

The graph of FIG. 6 shows an illustrative current density distribution for a device 30 of the type shown in FIG. 5. Between length l=0 and L/2, the current density under pad 62a is $J_1$. Between length l=L/2 and L, the current density under pad 62b is $J_2$. The current density $J_1$ is less than $J_2$, so the saturation power of the portion of device 30 under pad 62a is less than the saturation power of the portion of device 30 under pad 62b. The gain of the first portion (under pad 62a) is also less than the gain of the second portion (under pad 62b).

Figure 7:
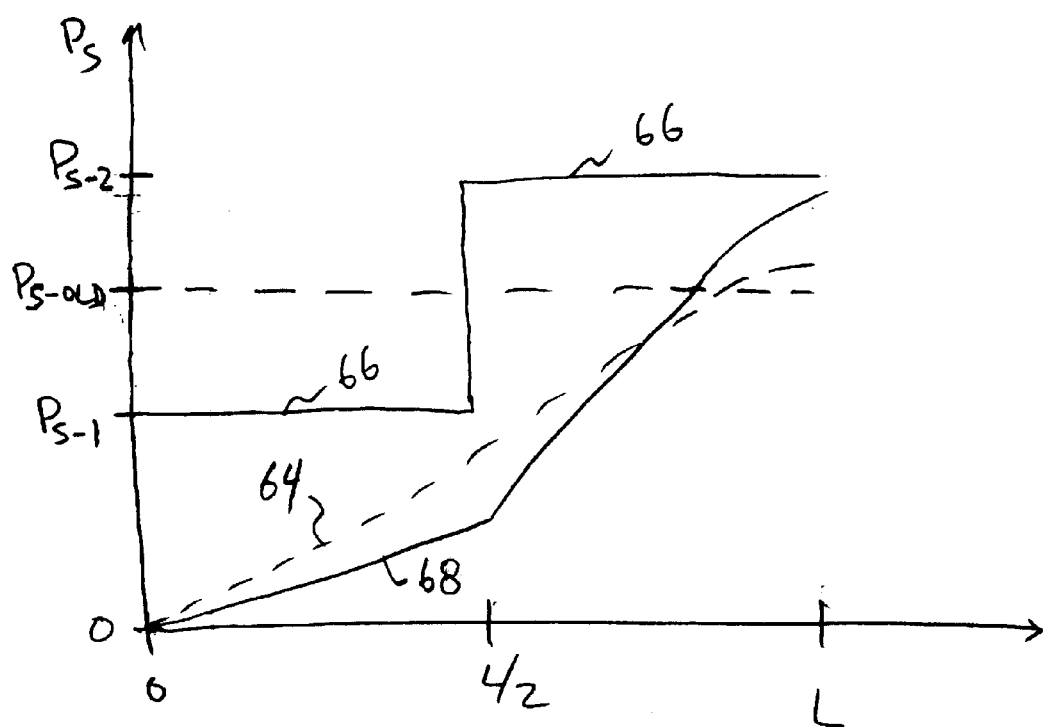
FIG. 7 is a graph showing how a semiconductor optical amplifier device with a nonuniform drive current profile may have greater output power handling capability than a semiconductor optical amplifier device with a uniform drive current profile in accordance with the present invention.

A graph that compares the evolution of illustrative optical data signals during amplification in a device 30 that uses a uniform drive current arrangement (uniform pumping) and a comparable device 30 that uses a nonuniform drive current arrangement (nonuniform pumping) is shown in FIG. 7. Under uniform pumping, a device such as the device of FIG. 4 may be pumped using a relatively uniform current density $J_0$ along the length of the semiconductor optical amplifier device waveguide. A device that is pumped in this way may be characterized by a saturation power $P_{S\text{-}OLD}$. As shown by dotted line 64, optical data signals that are provided at an input to the device (l=0) are amplified by the optical gain $g_0$ in the device as the optical data signals travel towards the device output (l=L). When the amplified optical data signal light reaches the saturation power $P_{S-OLD}$, it becomes increasingly difficult for the device to deliver more optical power. As a result, dotted line 64 begins to roll off as shown in FIG. 7. This roll-off indicates that the device is saturating. Not much more optical power can be delivered at the existing level of pump current density.

In comparison, when a semiconductor optical amplifier device is pumped with a nonuniform current density of the type shown in FIG. 6, the semiconductor device exhibits a nonuniform saturation power. As an example, a device that is pumped with a current density distribution of the type shown in FIG. 6 may have a saturation power that tracks the shape of the two region pump current density of FIG. 6. The low current density that is used in this example ($J_1$) may be lower than the current density $J_0$ that was used in the uniform pumping example and the high current density that is used ($J_2$) may be greater than $J_0$. In this case, the saturation power may have a characteristic of the type shown by solid line 66 in FIG. 7. Near the input of the device (l=0 to L/2), the saturation power $P_{S-1}$ is lower than the saturation power ($P_{S-OLD}$) produced by uniform pumping. Near the output of the device (l=L/2 to L), the saturation power ($P_{S-2}$) is higher than that associated with uniform pumping ($P_{S-OLD}$).

Under the operating conditions associated with the saturation power curve 66 of FIG. 7, the optical data signal power may evolve as shown by solid line 68. Initially, the optical data signal power increases more slowly than when the device was pumped at a uniform level. This is because the drive current density near the input of the device is lower than that used under the uniform pumping scenario so the optical gain $g_1$ is reduced relative to $g_0$ (the gain level used in the uniform pumping case). This tends to reduce amplified spontaneous emission noise (ASE). Because a high saturation power is not required when the optical data signal power level is low, the lower pump current in the vicinity of the device input does not adversely affect the performance of the device. The current density of the pump current used in the waveguide portion at the output of the device is large enough to produce more optical gain ($g_2$) than in the uniform pumping scenario ($g_0$), as shown by the steeper slope of line 68 between l=L/2 and l=L. This greater gain together with the higher saturation power characteristic in this region allows the output power from the semiconductor optical device to be greater than that possible under uniform pumping arrangements.

With the nonuniform drive current density, higher output power may be obtained without significantly altering the overall small signal gain of the device. For example, the average small signal gain of the device ($g_1+g_2$)/2 may be equal to or comparable to the gain $g_0$ of a device that uses uniform pumping. This allows the lasing condition (gain≧loss) to be avoided, as required for proper operation of the device as an optical amplifier. Spectral ripple in the gain of the amplifier is typically reduced, due to the relatively low overall drive current used to reach the same output power. Moreover, the tendency of the amplifier output power to become clamped due to saturation of the amplifier by amplified spontaneous emission light is reduced due to the high drive current at the amplifier output.

Figure 8:
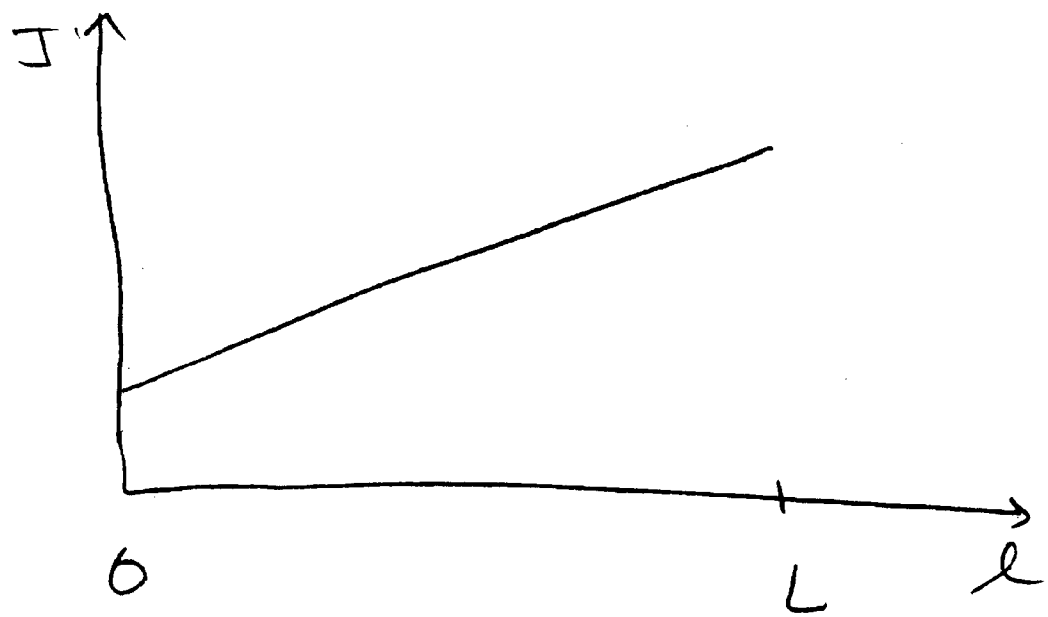
FIG. 8 is a graph of an illustrative nonuniform drive current density profile that may be used in operating a semiconductor optical device in accordance with the present invention.
Figure 9:
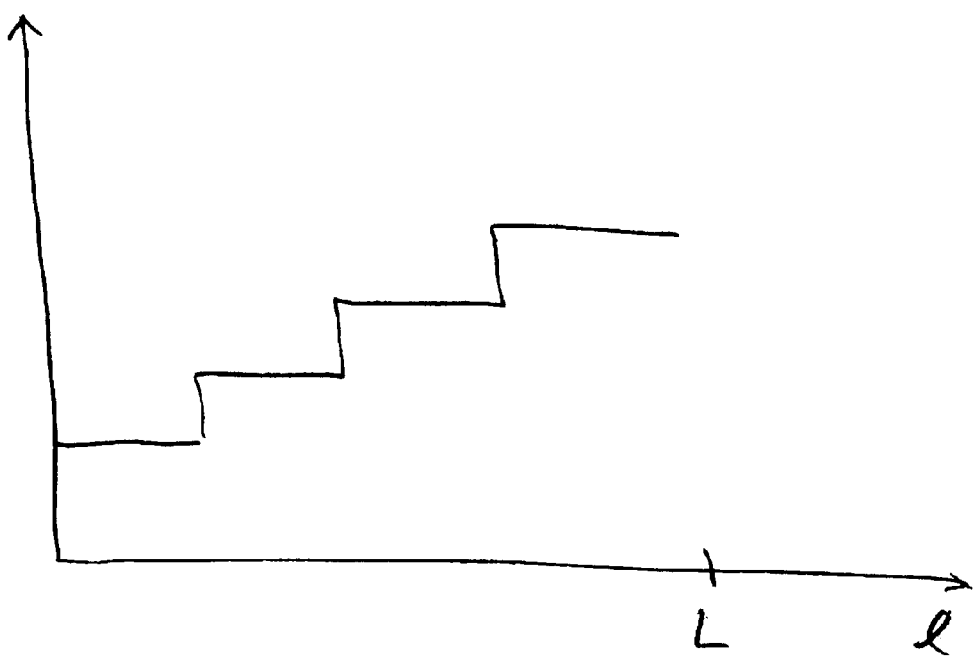
FIG. 9 is a graph of another illustrative nonuniform drive current density profile that may be used in operating a semiconductor optical device in accordance with the present invention.

It is not necessary that nonuniform pumping current densities be produced using the two drive current arrangement described in connection with FIGS. 5–7. For example, the drive current density can be varied smoothly along the length of the device, as shown in FIG. 8. If desired, numerous discrete drive regions may also be used to produce a semicontinuous drive current density profile that varies in a stepwise fashion, as shown in FIG. 9. If desired, a combination of a smoothly varying and a stepwise-varying profile may be used or any other suitable drive current distribution may be used. The current density may be uniform for a portion of the device and nonuniform for another portion of the device. Moreover, the current density may be distributed uniformly or nonuniformly across the width of the device.

Figure 10:
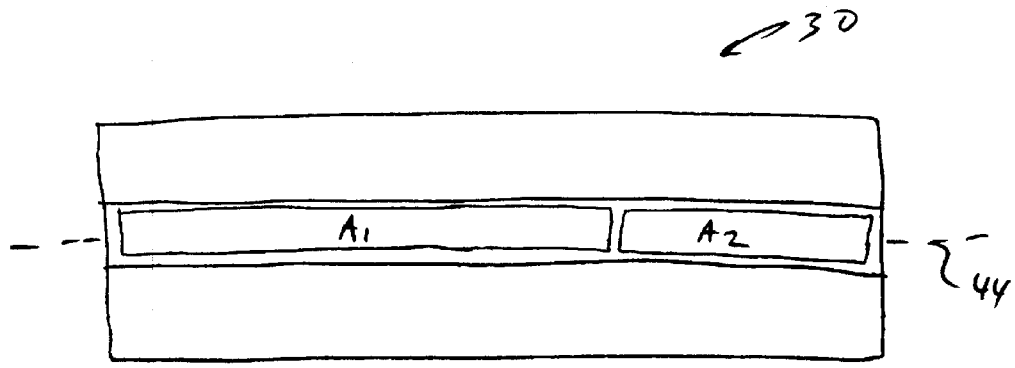
FIG. 10 is a top view of an illustrative semiconductor optical amplifier device showing how a nonuniform drive current density may be produced by using drive electrodes of different areas in accordance with the present invention.

Any suitable arrangement may be used for creating a nonuniform drive current density distribution in the semiconductor optical device. For example, as shown in the top view of FIG. 10, different pad areas $A_1$ and $A_2$ may be used and each driven with the same drive current. As a result, the current density provided to the underlying device will vary along the length of the waveguide region.

Figure 11:
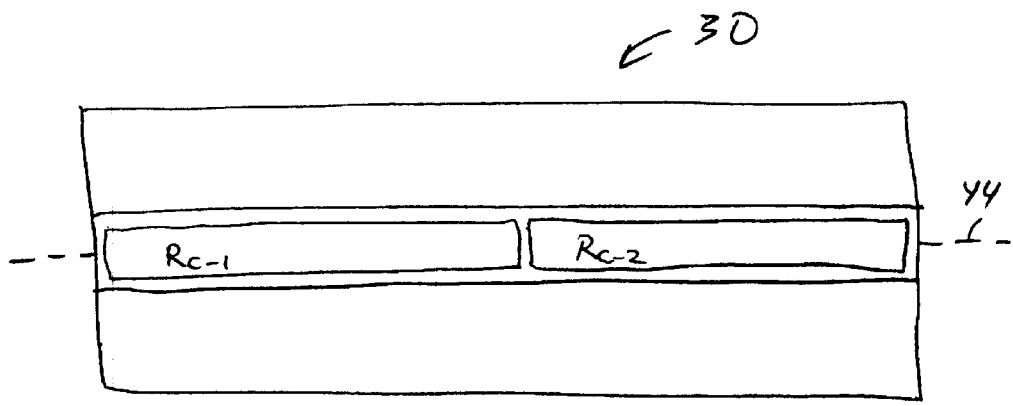
FIG. 11 is a top view of an illustrative semiconductor optical amplifier device showing how a nonuniform drive current density may be produced by using drive electrodes with different contact resistances in accordance with the present invention.

Even if the pad areas are the same, different drive current densities may be established when the contact resistance $R_{C-1}$ under one pad differs from the contact resistance $R_{C-2}$ under another pad, as shown in the top view of device 30 in FIG. 11.

Figure 12:
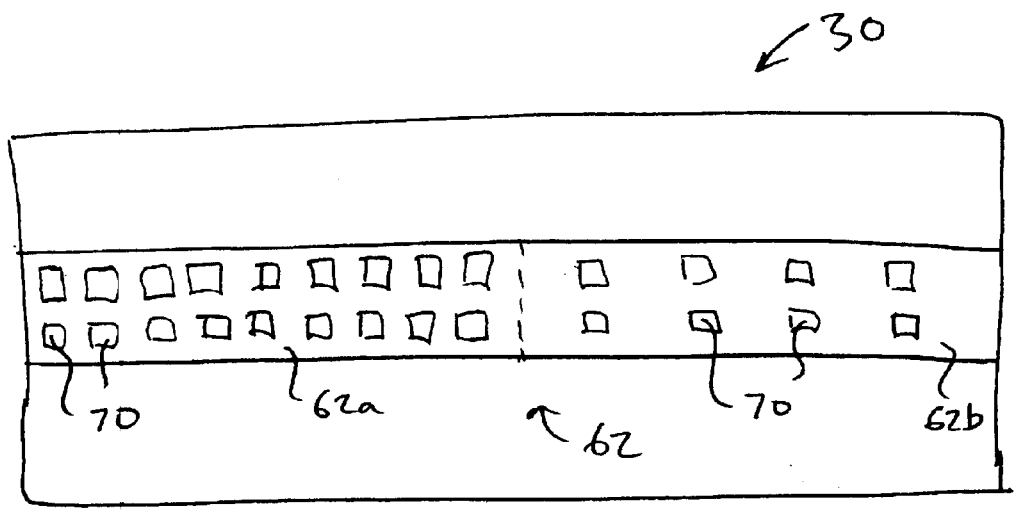
FIG. 12 is a top view of an illustrative semiconductor optical amplifier device showing how a nonuniform drive current density may be produced by using drive electrodes with different effective contact areas in accordance with the present invention.

Another approach is shown in FIG. 12. As shown in the top view of device 30 in FIG. 12, a contact pad 62 may have a number of holes or inactive regions 70. The density of inactive regions may be greater over the initial or input portion of the waveguide (pad portion 62a in the FIG. 12 example) and smaller when overlying the later or output power portion of the waveguide (pad portion 62b).

Figure 13:
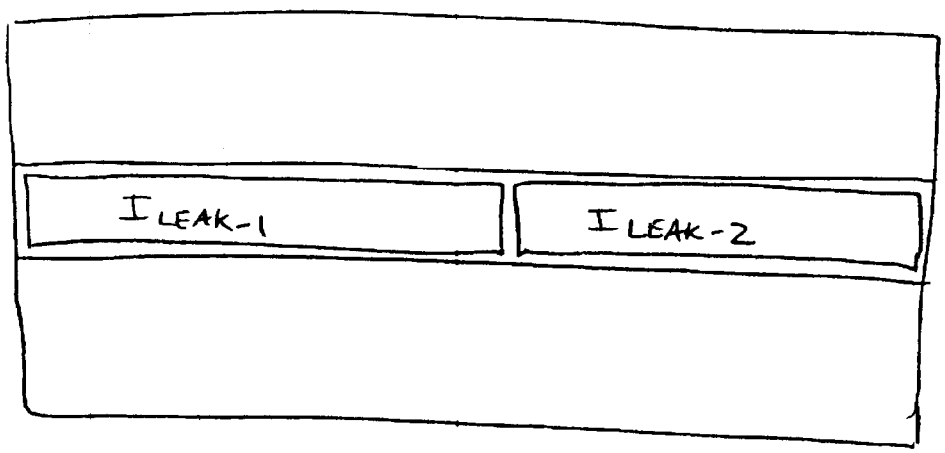
FIG. 13 is a top view of an illustrative semiconductor optical amplifier device showing how a nonuniform drive current density may be produced by using drive electrodes with different leakage currents in accordance with the present invention.

The leakage current for different regions of the device need not be uniform. As shown in FIG. 13, if different portions of the area overlying the waveguide have different leakage currents $I_{LEAK-1}$ and $I_{LEAK-2}$, the effective drive current density for the active region under each pad portion (62a and 62b) may be different.

If desired, combinations of these approaches or any other suitable approaches may be used to adjust the active region drive current density and therefore the saturation power characteristics of device 30 along the length of the waveguide region of the device.

The semiconductor optical amplifier device arrangements described in connection with amplifier 18 may be provided for use in amplifiers or any other suitable network equipment.

It will be understood that the foregoing is merely illustrative of the principles of this invention, and that various modifications can be made by those skilled in the art without departing from the scope and spirit of the invention.

What is claimed is:

1. A semiconductor optical amplifier device that amplifies optical data signals in a fiber-optic communications link, comprising:

an active semiconductor region that is driven to produce optical gain for the optical data signals;

a waveguide that laterally confines the optical data signals being amplified, wherein the waveguide has a longitudinal axis and a length along the longitudinal axis;

conductive paths for providing a drive current to the active semiconductor region, wherein the drive current has a nonuniform density along the length of the waveguide; and contact pads on the waveguide, wherein the contact pads have different sizes.

2. A semiconductor optical amplifier device that amplifies optical data signals in a fiber-optic communications link, comprising:

an active semiconductor region that is driven to produce optical gain for the optical data signals;

a waveguide that laterally confines the optical data signals being amplified, wherein the waveguide has a longitudinal axis and a length along the longitudinal axis;

conductive paths for providing a drive current to the active semiconductor region, wherein the drive current has a nonuniform density along the length of the waveguide; and at least one contact pad having different amounts of contact area per unit length along the waveguide.

3. A semiconductor optical amplifier device that amplifies optical data signals in a fiber-optic communications link, comprising:

an active semiconductor region that is driven to produce optical gain for the optical data signals;

a waveguide that laterally confines the optical data signals being amplified, wherein the waveguide has a longitudinal axis and a length along the longitudinal axis; and conductive paths for providing a drive current to the active semiconductor region, wherein the drive current has a nonuniform density along the length of the waveguide, wherein different amounts of leakage current are associated with different portions of the waveguide and wherein the different amounts of leakage current result in different drive current densities for pumping the active region along the waveguide.

4. A semiconductor optical amplifier device that amplifies optical data signals in a fiber-optic communications link, comprising:

an active semiconductor region that is driven to produce optical gain for the optical data signals;

a waveguide that laterally confines the optical data signals being amplified, wherein the waveguide has a longitudinal axis and a length along the longitudinal axis;

conductive paths for providing a drive current to the active semiconductor region, wherein the drive current has a nonuniform density along the length of the waveguide; and a contact pad having different associated contact resistances at different positions along the length of the waveguide.

5. A semiconductor optical amplifier device that amplifies optical data signals in a fiber-optic communications link, comprising:

an active semiconductor region that is driven to produce optical gain for the optical data signals;

a waveguide that laterally confines the optical data signals being amplified, wherein the waveguide has a longitudinal axis and a length along the longitudinal axis; and conductive paths for providing a drive current to the active semiconductor region, wherein the drive current has a nonuniform density along the length of the waveguide, wherein the drive current density varies in a stepwise fashion along the length of the waveguide.

6. A semiconductor optical amplifier device that amplifies optical data signals in a fiber-optic communications link, comprising:

an active semiconductor region that is driven to produce optical gain for the optical data signals;

a waveguide that laterally confines the optical data signals being amplified, wherein the waveguide has a longitudinal axis and a length along the longitudinal axis; and conductive paths for providing a drive current to the active semiconductor region, wherein the drive current has a nonuniform density along the length of the waveguide, wherein the drive current density varies smoothly for at least a portion of the length of the waveguide.

7. An optical amplifier that amplifies optical data signals in a fiber-optic communications link, comprising:

an input fiber that receives the optical data signals from the fiber-optic communications link;

an output fiber with which corresponding amplified optical data signals are provided to the fiber-optic communications link;

at least first and second semiconductor optical amplifier devices that amplify the optical data signals between the input fiber and the output fiber; and an isolator between the first and second semiconductor optical amplifier devices, wherein at least one of the semiconductor optical amplifier devices includes:

an active semiconductor region that is driven to produce optical gain for the optical data signals;

a waveguide that laterally confines the optical data signals being amplified, wherein the waveguide has a longitudinal axis and a length along the longitudinal axis; and conductive paths for providing a drive current to the active semiconductor region, wherein the drive current has a nonuniform density along the length of the waveguide and wherein at least one of the semiconductor optical amplifier devices further comprises contact pads on the waveguide, wherein the contact pads have different sizes.

8. An optical amplifier that amplifies optical data signals in a fiber-optic communications link, comprising:

an input fiber that receives the optical data signals from the fiber-optic communications link;

an output fiber with which corresponding amplified optical data signals are provided to the fiber-optic communications link;

at least first and second semiconductor optical amplifier devices that amplify the optical data signals between the input fiber and the output fiber; and an isolator between the first and second semiconductor optical amplifier devices, wherein at least one of the semiconductor optical amplifier devices includes:

an active semiconductor region that is driven to produce optical gain for the optical data signals;

a waveguide that laterally confines the optical data signals being amplified, wherein the waveguide has a longitudinal axis and a length along the longitudinal axis; and conductive paths for providing a drive current to the active semiconductor region, wherein the drive current has a nonuniform density along the length of the waveguide and wherein at least one of the semiconductor optical amplifier devices further comprises at least one contact pad having different amounts of contact area per unit length along the waveguide.

9. An optical amplifier that amplifies optical data signals in a fiber-optic communications link, comprising:

an input fiber that receives the optical data signals from the fiber-optic communications link;

an output fiber with which corresponding amplified optical data signals are provided to the fiber-optic communications link;

at least first and second semiconductor optical amplifier devices that amplify the optical data signals between the input fiber and the output fiber; and an isolator between the first and second semiconductor optical amplifier devices, wherein at least one of the semiconductor optical amplifier devices includes:

an active semiconductor region that is driven to produce optical gain for the optical data signals;

a waveguide that laterally confines the optical data signals being amplified, wherein the waveguide has a longitudinal axis and a length along the longitudinal axis; and conductive paths for providing a drive current to the active semiconductor region, wherein the drive current has a nonuniform density along the length of the waveguide and wherein at least one of the semiconductor optical amplifier devices further comprises a contact pad having different associated contact resistances at different positions along the length of the waveguide.

10. An optical amplifier that amplifies optical data signals in a fiber-optic communications link, comprising:

an input fiber that receives the optical data signals from the fiber-optic communications link;

an output fiber with which corresponding amplified optical data signals are provided to the fiber-optic communications link;

at least first and second semiconductor optical amplifier devices that amplify the optical data signals between the input fiber and the output fiber; and an isolator between the first and second semiconductor optical amplifier devices, wherein at least one of the semiconductor optical amplifier devices includes:

an active semiconductor region that is driven to produce optical gain for the optical data signals;

a waveguide that laterally confines the optical data signals being amplified, wherein the waveguide has a longitudinal axis and a length along the longitudinal axis; and conductive paths for providing a drive current to the active semiconductor region, wherein the drive current has a nonuniform density along the length of the waveguide and wherein the drive current density for at least one of the semiconductor optical amplifier devices varies in a stepwise fashion along the length of the waveguide in that device.

* * * * *